US009255325B2

(12) United States Patent
Vollmar

(10) Patent No.: US 9,255,325 B2
(45) Date of Patent: Feb. 9, 2016

(54) METHOD AND APPARATUS FOR IGNITING SILICON RODS OUTSIDE A CVD-REACTOR

(75) Inventor: Wilfried Vollmar, Soest (DE)

(73) Assignee: Centrotherm Sitec GmbH (DE)

( * ) Notice: Subject to any disclaimer, the term of this patent is extended or adjusted under 35 U.S.C. 154(b) by 0 days.

(21) Appl. No.: 13/807,334

(22) PCT Filed: Jul. 25, 2011

(86) PCT No.: PCT/EP2011/003724
§ 371 (c)(1),
(2), (4) Date: Feb. 25, 2013

(87) PCT Pub. No.: WO2012/010329
PCT Pub. Date: Jan. 26, 2012

(65) Prior Publication Data
US 2013/0209684 A1  Aug. 15, 2013

Related U.S. Application Data

(60) Provisional application No. 61/371,864, filed on Aug. 9, 2010.

(30) Foreign Application Priority Data
Jul. 23, 2010  (DE) .......................... 10 2010 032 103

(51) Int. Cl.
*C23C 16/24* (2006.01)
*C01B 33/035* (2006.01)
(52) U.S. Cl.
CPC ............... *C23C 16/24* (2013.01); *C01B 33/035* (2013.01)

(58) Field of Classification Search
None
See application file for complete search history.

(56) References Cited

U.S. PATENT DOCUMENTS

| 4,309,241 | A | * | 1/1982 | Garavaglia et al. ............ 117/29 |
| 6,365,225 | B1 | | 4/2002 | Chandra et al. |
| 2006/0061295 | A1 | | 3/2006 | Vollmar et al. |
| 2009/0130333 | A1 | * | 5/2009 | Kim et al. .................... 427/545 |
| 2009/0191336 | A1 | | 7/2009 | Chandra et al. |
| 2010/0231039 | A1 | * | 9/2010 | Wallmeier et al. ............ 307/17 |
| 2013/0209684 | A1 | | 8/2013 | Vollmar |

FOREIGN PATENT DOCUMENTS

| DE | 10 2007 041 803 | 3/2009 |
| DE | 20 2009 003 325 | 7/2009 |
| DE | 20 2009 003 325 U1 | 7/2009 |

(Continued)

OTHER PUBLICATIONS

Instruction Manual Type Gunclean Toftejorg SSt40T, Jun. 9, 2012.

*Primary Examiner* — Joseph Miller, Jr.
(74) *Attorney, Agent, or Firm* — Tarolli, Sundheim, Covell & Tummino, LLP

(57) ABSTRACT

A method and a device for igniting silicon rods outside a CVD-reactor. A silicon rod is disposed inside a chamber of a casing of an ignition device. At least one pair of contact electrodes applies a first voltage supplied by a transformer with an open circuit voltage sufficiently high to initialize a current flow in and ignite the silicon rod. Optionally, the silicon rod may be heated by a current flow and/or an external heating unit to a temperature within a predetermined range. The silicon rod is removed from the ignition device and may be exposed to a depositing process inside a CVD-reactor. The ignition of the silicon rod outside the CVD-reactor facilitates a new ignition for the depositing process.

2 Claims, 2 Drawing Sheets

(56) References Cited

FOREIGN PATENT DOCUMENTS

| DE | 10 2009 021 403 | | 1/2010 |
|---|---|---|---|
| DE | 10 2009 021 403 | A1 | 1/2010 |
| DE | 10 2010 032 103 | | 1/2012 |
| GB | 922 280 | | 3/1963 |
| WO | 2009026915 | | 3/2009 |

\* cited by examiner

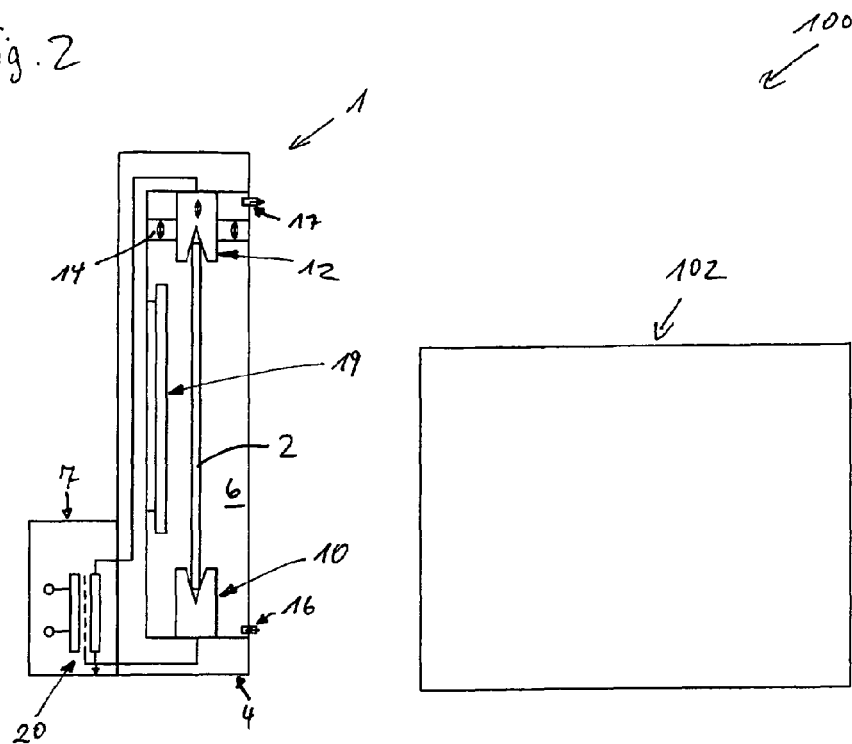
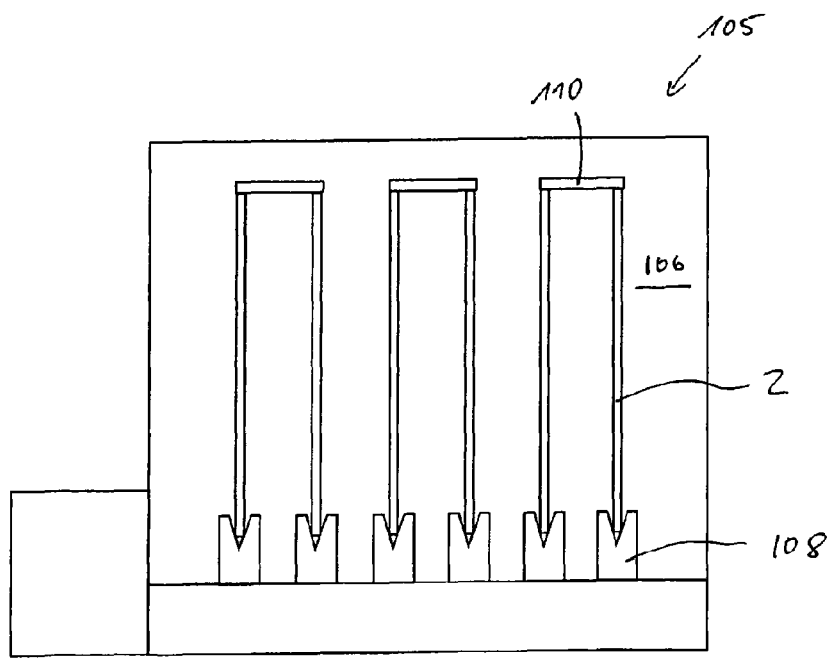

US 9,255,325 B2

METHOD AND APPARATUS FOR IGNITING SILICON RODS OUTSIDE A CVD-REACTOR

RELATED APPLICATION

This application corresponds to PCT/EP20111003724, filed Jul. 25, 2011, which claims the benefit of German Application No. 10 2010 032 103.6, filed Jul. 23, 2010, and U.S. Provisional Appln. Ser. No. 61/371,864, filed Aug. 9, 2010 the subject matter of which is incorporated herein by reference in its entirety.

FIELD OF THE INVENTION

The present invention relates to a method and an apparatus for igniting silicon rods outside of a CVD-Reactor as well as a method and an apparatus for depositing silicon on a silicon rod.

BACKGROUND OF THE INVENTION

In the area of semiconductors and photovoltaics, it is known to produce high purity silicon rods, e.g. according to the Siemens method in deposition reactors, which are also known as CVD-reactors. In this method, thin silicon rods are first placed in the reactors. Thereafter, silicon is deposited on these thin silicon rods during a deposition process in order to produce thicker rods. The silicon rods are first retained in clamping and contacting devices, wherein these clamping and contacting devices maintain the silicon rods in a desired orientation and provide for electrical contacting thereof. Two of the silicon rods are respectively connected at their free ends by electrically conductive bridges or bridges made from silicon material in order to form an electrical circuit via contacting devices located on the same side of the reactor. However, it is also possible to electrically contact the silicon rods their opposing ends, i.e. from above and from below.

The silicon rods are heated to a predetermined processing temperature at which deposition of silicon from a vapor or gas phase takes place on the silicon rods. The silicon rods are heated by resistance heating during the deposition process by a current flow at a predetermined voltage, where appropriate, the silicon rods may also be heated by an external heating unit. The deposition temperature usually lies between 900 and 1200° C. and particularly at about 1100° C. However, the deposition temperature may also be another temperature.

Initially, the silicon rods have a high resistance. In order to initiate an initial current flow in the silicon rod, at first a high voltage has to be applied. When doing this, the silicon rod changes from a non-conductive condition to a conductive condition, which is referred to as ignition in the following. The resistance markedly decreases after the ignition and particularly decreases when the temperature rises. For igniting the silicon rods and for subsequently heating the silicon rods up to the predetermined processing temperature, a sophisticated multi-stage power supply having different power supply units is required. Such a power supply is known e.g. from DE 10 2009 021 403 A or from DE 10 2010 020 740 A, which belongs to the same applicant as the present application but has not been published prior to filing the present application. In particular, a designated power supply unit for the ignition process is required.

The problem to be solved by the present invention is to provide a method and an apparatus decreasing the requirements in an ignition operation and an ignition unit in a CVD-reactor, respectively.

SUMMARY OF THE INVENTION

The problem is solved by a method according to the present invention. Further embodiments of the invention are described herein.

Particularly, a method for igniting silicon rods outside of a CVD-reactor for preparing the silicon rods for a subsequent treatment in a CVD-reactor is provided. In the method, a silicon rod is disposed in an ignition device, and a first voltage is applied to the silicon rod by means of a first power supply unit, wherein the voltage is sufficient for igniting the silicon rod. Thereafter, current is conducted through the silicon rod via the first power supply unit, and the silicon rod is heated at least partially by the current flow to a temperature within a predetermined temperature range. Thereafter, the silicon rod is removed from the ignition device. The inventors found out that a silicon rod, once it has been ignited, may be ignited by use of a lower voltage in subsequent ignition processes when compared to the first ignition. Thus, silicon rods could be ignited e.g. in a second ignition by use of voltages which were between 30% and 40% lower than at the first ignition. The method mentioned above thus provides for preparation of the silicon rods for a subsequent CVD-treatment, wherein the preparation simplifies the CVD-treatment and the device required therefor. Particularly, the ignition operation for a subsequent CVD-treatment may be substantially simplified by the above-mentioned method.

Preferably, a gas atmosphere is formed around the silicon rod during the process after the silicon rod has been disposed in the ignition device, wherein the gas atmosphere is composed in such a way that no reaction between the gas and the silicon rod occurs during ignition and heating. To this end, the gas atmosphere is formed e.g. generally from $N_2$, $H_2$, an inert gas, or mixtures of two or more of these gases.

In order to facilitate subsequent ignition events, the silicon rod is heated to a temperature in a range between 400° C. and 700° C. and preferably to a temperature in a region between 450° C. and 600° C. The inventors found out that, even though one single ignition already facilitates subsequent ignition events, the effect becomes even better if the silicon rod is heated to an elevated temperature. A temperature region between 400° C. and 700° C. and particularly between 450° C. and 600° C. has been recognized as an advantageous temperature range, since the effect showed a particularly high increase in this region. At lower and higher temperatures, the changes were smaller, though. The best temperature may be dependent on the silicon rod and the doping thereof.

In order to reach the temperature within the predetermined temperature range, the silicon rod may be at least partially heated by a heating device spaced from the silicon rod, particularly a heating device using infrared radiation. By this means, the demands on the power supply unit for conducting current through the silicon rod may be reduced. Furthermore, the residence time of a silicon rod in the ignition device may be shortened, since the heating process may be accelerated. Also, the heating device may heat the silicon rod already before ignition, which, in turn, facilitates the first ignition event. The first voltage is preferably in a range between 8 kV and 15 kv for a good ignition.

In one embodiment, a plurality of silicon rods is arranged in the ignition device, and the silicon rods are connected to a first voltage at the same time or sequentially, in order to ignite the silicon rods and heat the silicon rods thereafter.

Furthermore, a method for depositing silicon on a silicon rod is provided, wherein initially a method as was described above is carried out. Thereafter, a plurality of previously ignited and heated silicon rods is disposed in a CVD-reactor, and a second voltage is applied to each of the silicon rods by means of a second power supply unit, in order to ignite the silicon rods again. Thereafter, a third voltage is applied to each of the silicon rods by means of a third power supply unit, in order to heat the silicon rods to a temperature within another predetermined temperature range, wherein the third voltage is lower than the second voltage. Furthermore, a gas atmosphere is formed in the CVD-reactor, the gas atmosphere effecting deposition of silicon on the silicon rod, at least within the other predetermined temperature range. By pre-igniting the silicon rods outside the CVD-reactor, the new ignition in the CVD-reactor is facilitated, and the residence time of the silicon rods in the CVD-reactor may be reduced. Furthermore, the construction of the CVD-reactor may be simplified in the above-mentioned method, since lower voltages are required for the second ignition in the CVD-reactor when compared to the first ignition. In this sense, also the second voltage is preferably lower than the first voltage.

According to the invention, in a device for igniting silicon rods outside a CVD-reactor in order to prepare the silicon rods for a subsequent treatment in a CVD-reactor, the device comprises a casing having a chamber for housing at least one silicon rod, at least one pair of contacting electrodes in the chamber for holding a silicon rod therebetween, and a first power supply unit. The first power supply unit comprises at least one transformer, wherein each output of the transformer is connected to a contacting electrode of one pair, and wherein the transformer comprises an open circuit voltage which is sufficiently high, in order to initialize a current flow in the silicon rod. With such a device, the benefits discussed above, referring to the method may be attained. The transformer may comprise an open circuit voltage in a range between 8 kV and 15 kV in order to facilitate a reliable and fast ignition of the silicon rod.

Preferably, the device comprises means for adjusting a predetermined gas atmosphere in the chamber in order to inhibit e.g. an oxidation of the silicon rods during an ignition event and during a subsequent heating process.

Furthermore, at least one heating device may be provided, wherein the heating device is arranged in such a way that a silicon rod inside the chamber may be heated by means of radiation energy. Particularly, the heating device may comprise an infrared radiator or emitter, which provides for good energy coupling into the silicon rod without contact.

In order to be able to ignite a plurality of silicon rods at the same time or sequentially without loading/unloading operations in-between, a plurality of contact electrodes is provided in the chamber. Furthermore, an apparatus for depositing silicon on a silicon rod is provided, which comprises a device, as was described above, in combination with a CVD-reactor. In such an apparatus, the CVD-reactor comprises a plurality of contacting electrodes for holding a plurality of silicon rods, at least one second and one third power supply unit, as well as means for forming a gas atmosphere in the CVD-reactor, thus causing deposition of silicon on silicon rods at a temperature in a predetermined temperature range. The second power supply unit includes a transformer which has an open circuit voltage sufficient for igniting a silicon rod. The third power supply is adapted for directing a current through the silicon rods, which is higher than a short circuit current of the transformer of the second power supply unit.

BRIEF DESCRIPTION OF THE DRAWINGS

In the following, the invention will be explained in more detail referring to the figures, wherein:

FIG. 2 is a schematic view of an apparatus for carrying out a CVD-method according to the invention.

DETAILED DESCRIPTION

Figure 1:
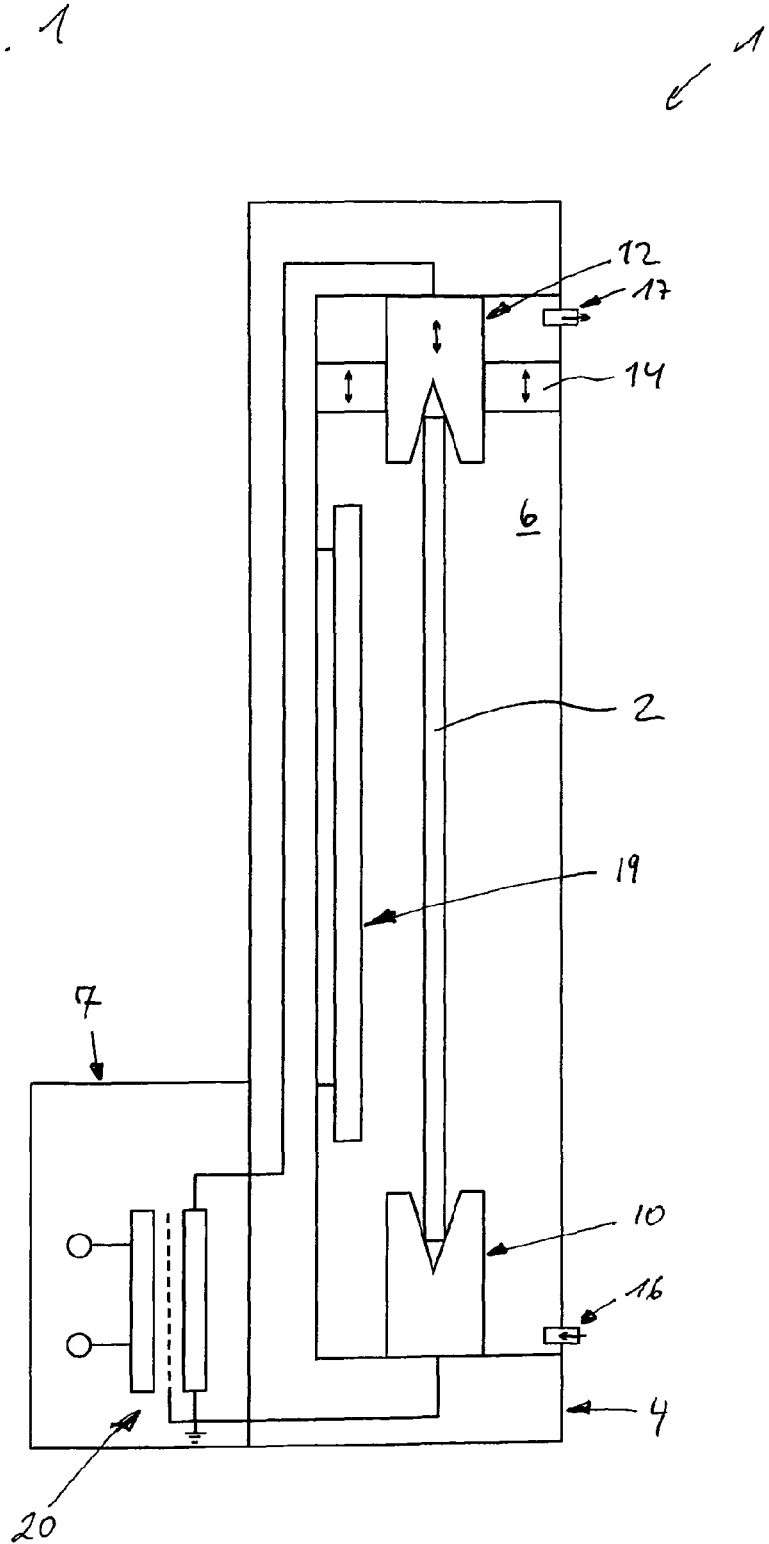
FIG. 1 shows a schematic illustration of a device for igniting a silicon rod outside a CVD reactor.

Terms used in the following specification related to locations and directions, respectively, primarily relate to the illustrations in the figures. Thus, these terms shall not be regarded as limiting. These terms may refer to a preferred final arrangement, though.

FIG. 1 shows a schematic illustration of a device 1 for igniting a silicon rod 2 outside a CVD-reactor. This means the device 1 is not designed as a CVD-reactor.

The device 1 generally consists of a main casing 4 defining a process chamber 6 therein. A switchbox 7 is shown adjacent to the main casing 4, although the switchbox 7 may also be integrated into the main casing 4. The main casing 4 is formed from a suitable material, which provides for thermal isolation of the process chamber with respect to the environment.

A lower silicon rod support 10 as well as an upper silicon rod support 12 is provided within the process chamber 6. The upper silicon rod support 12 is supported within the process chamber 6 by means of holding units 14 such that it is vertically adjustable, as is shown by double arrows in FIG. 1. The lower silicon rod support 10 is provided stationary at the bottom of the process chamber 6 and is made of an electrically conducting material which does not contaminate the silicon rod, such as graphite. The lower silicon rod support 10 may be of a design as described e.g. in DE 20 2010 002486 U, which is incorporated herein by reference, in order to avoid undue repetitions.

The upper silicon rod support 12 may generally have the same design. The upper silicon rod support 12 is supported from the side by means of holding units 14, which are mounted to side walls of the process chamber in a vertically adjustable manner. Thereby, the distance between the silicon rod supports 10 and 12 may be adjusted, depending on the length of the silicon rod 2. Thus, good contacting of each silicon rod 2 may be ensured. In particular, it is possible to maintain the upper silicon rod support 12 freely movable over a certain travel range and it is also possible that the upper silicon rod support 12 rests on a respective silicon rod 2, which is retained between the silicon rod supports 10 and 12, from above by means of gravity. In the region of the process chamber 6, at least one gas supply 16 as well as one gas exhaust 17 are provided. The gas supply 16 is located in a lower region of the process chamber 6, whereas the gas exhaust 17 is provided in an upper region of the process chamber 6. Of course, it is also possible to arrange the gas exhaust 17 at the bottom and the gas supply 16 at the top.

Furthermore, a heating unit 19 is provided in the process chamber 6. The heating unit 19 shown is of a type which is adapted for heating the silicon rod by means of radiation, i.e. contactless. The heating unit 19 may comprise at least one infrared radiator. Of course, it would also be possible to arrange the heating unit 19 outside the process chamber 6, as long as the process chamber 6 comprises a window, which is transparent to the radiation of the heating unit 19. The heating unit 19 could also heat a chamber wall of the process chamber 6, in order to indirectly heat the silicon rod 2. However, direct heating by radiation of the heating unit 19 is preferred, since it acts fast and may be controlled in a fast manner.

A power supply comprising a transformer 20 is provided within the switchbox 7. The transformer 20 is connectable to a single phase alternate current of e.g. 400 Volts on its primary side. On its secondary side, the transformer is constructed in such a way that the transformer outputs an open circuit voltage in a range of 8kV-15kV.

The transformer is constructed as a so-called soft transformer, which comprises e.g. an air gap and comprises a steep decreasing current-voltage-characteristic when the current flow increases. The secondary side of the transformer 20 is electrically connected to the lower and upper silicon rod supports 10 and 12, respectively. In this arrangement, the lower silicon rod support 10 is grounded, whereas the high voltage is applied to the upper silicon rod support 12. This arrangement may of course also be inverted.

Even though only one lower and one upper silicon rod support 10 and 12, respectively, are shown in FIG. 1, it is to be noted that a plurality of lower and upper silicon rod supports 10, 12 may be provided in pairs in the process chamber 6, in order to be able to hold a plurality of silicon rods in the process chamber 6 at the same time. For each pair of lower and upper silicon rod supports 10, 12, an associated transformer may be provided. However, it is also possible that pairs of lower and upper silicon rod supports 10, 12 are connectable to the same transformer, wherein one control unit may be provided, which sequentially connects the transformer to the corresponding pairs, in order to sequentially ignite the retained silicon rods.

In the following, the operation of the device 1 is explained in more detail, referring to FIG. 1.

Initially, a silicon rod 2 is inserted between the silicon rod supports 10, 12 and thereafter the process chamber 6 is closed. The process chamber 6 is flushed with a gas by means of the lower gas supply 16, wherein the gas does not influence the following process. A suitable gas is e.g. $N_2$, $H_2$, or another inert gas, such as Argon.

Flushing is continued until the entire process chamber 6 is filled with this gas. In order to ensure that the whole process chamber is filled with gas, gas may be e.g. exhausted via the upper gas exhaust 17 and a sensor within the gas exhaust 17 may detect that no other gases exit from the process chamber 6. At this point in time, a voltage in a range between 8kV and 15 kV is applied between the lower silicon rod support 10 and the upper silicon rod support 12 and is thus applied to the silicon rod 2 by means of the current supply, particularly by means of the transformer 20. The silicon rod 2 will begin to conduct current after a certain time of e.g. 4 to 5 minutes. At this point in time, the silicon rod is said to have ignited, i.e. has changed from a non-conducting condition to a conducting condition.

When the silicon rod 2 begins to conduct current, the voltage quickly drops and the current flow increases. Resistance heating occurs within the silicon rod 2, caused by the current flow. The silicon rod 2 is heated to a temperature in a range of from 450° C. to 600° C. by use of this heating effect and by use of the heating unit 19, if provided. The heating unit 19 may also heat the silicon rod 2 before the ignition thereof in order to facilitate the ignition and in order to accelerate the whole process.

Thereafter, the current flow through the silicon rod 2 is discontinued, and the silicon rod 2 is cooled to a handling temperature within the process chamber 6. This cooling process may be accelerated by an increased gas flow through the process chamber 6. Thereafter, the silicon rod 2 is removed from the process chamber 6 and may be first temporarily stored for future processing in a CVD-reactor or may be directly inserted into the CVD-reactor.

FIG. 2 shows an apparatus 100 for carrying out CVD-processing. The apparatus 100 comprises a device 1, as was described above, a silicon rod storage 102, as well as a CVD-reactor 105.

The silicon rod storage 102 is any suitable type of storage in which a plurality of silicon rods 2 may be securely stored. Preferably, the silicon rod storage 102 should comprise a chamber in which a predetermined gas atmosphere may be adjusted, particularly a gas atmosphere free of oxygen. In case the silicon rods 2 should be processed once again before insertion into the CVD-reactor 105, particularly, in case the silicon rods 2 shall be etched, the predetermined gas atmosphere could be dispensed with.

The CVD-reactor 105 may be any known type of a CVD-reactor, wherein the electric circuit for connecting the silicon rods 2 inside the CVD-reactor may be simplified when compared to a commonly known circuit. Particularly, the first ignition stage may be completely omitted, since pre-ignited silicon rods 2 may on the one hand be ignited faster and may on the other hand be ignited at lower voltages.

As is shown in FIG. 2, the CVD-reactor 105 has a process chamber 106, wherein a plurality of silicon rod supports 108 is provided at the bottom of the process chamber 106. Each of these silicon rod supports 108 is adapted to support a silicon rod 2 in a free-standing manner. The free-standing silicon rods 2 are electrically connected to each other at their upper ends via bridges 110, respectively, as is known in the art. The silicon rod supports 108 may be e.g. of the above-referenced type.

The silicon rod supports 108 are connected in pairs to at least two power supply units not shown in detail, wherein the pairs correspond to the silicon rods connected in pairs. Particularly, a power supply unit having a transformer is provided, wherein the transformer comprises an open circuit voltage, which is sufficient to ignite a pre-ignited silicon rod a second time. Therefore, the transformer may comprise a lower open circuit voltage than is usually provided. Particularly, a transformer having an open circuit voltage in a range of 6 kV-4kV is considered. Furthermore, another power supply unit is provided, which is able to direct a current through the silicon rods 2, wherein the current is higher than a short circuit voltage of the transformer.

In the following, the method of the invention for carrying out a CVD deposition will be explained in more detail referring to FIG. 2.

Initially, the silicon rods 2 are pre-ignited in the manner described above referring to FIG. 1, and the silicon rods 2 are heated to a predetermined temperature. Thereafter, the silicon rods 2 are removed from the device 1 and are optionally stored in silicon rod storage 102. A plurality of silicon rods 2 may be pre-ignite one after another in device 1 in the manner described above.

Once a sufficient number of silicon rods 2 for loading a CVD-reactor 105 has been pre-ignited, these silicon rods 2 are inserted into the CVD-reactor 105 in the manner shown in FIG. 2. Thereafter, the silicon rods 2 are treated in the CVD-reactor 105 in a known manner.

In the CVD-reactor 105, lower voltages, i.e. 30% to 40% lower voltages than normally, are required for re-igniting the silicon rods 2, because the silicon rods 2 have already been pre-ignited in device 1. Therefore, a substantial time-saving is achieved. In particular, the silicon rods are connected to a voltage via a power supply including the transformer, in order to ignite the silicon rods. After ignition, current is directed through the silicon rods by means of another power supply, in order to heat the silicon rods to a temperature in a predetermined temperature range, e.g. between 900° C. and 1200° C. Thereafter, suitable process gases are supplied into the process chamber 106, in order to cause a silicon deposition on the silicon rods 2 from the gas phase. Finally, the silicon rods 2 are cooled again and are removed from the CVD-reactor.

While the pre-ignition process inside the device 1 takes several minutes (e.g. about 10 to 15 minutes including handling times), the CVD-process inside the CVD-reactor is very time-consuming and takes e.g. 80 to 100 hours. Thus, the device 1 is able to pre-ignite a sufficient number of silicon rods 2 for one or more CVD reactors, particularly if a plurality of silicon rods 2 can be received in the device 1 at the same time.

The invention has been explained in detail above, referring to preferred embodiments of the invention, wherein the invention is not limited to the embodiments shown. Specifically, the design of the device 1 and also of the CVD-reactor 105 may differ from the shown form.

The invention claimed is:

1. A method for igniting silicon rods outside a CVD-reactor for preparing a silicon rod for subsequent processing in a CVD-reactor, wherein the method comprises the following steps:
   disposing a silicon rod in an ignition device;
   applying a first voltage to the silicon rod by means of a first power supply unit, wherein the voltage is sufficient to ignite the silicon rod;
   conducting current through the silicon rod by means of the first power supply, in order to heat the silicon rod to a temperature within a predetermined temperature range;
   removing the silicon rod from the ignition device;
   disposing a plurality of previously ignited silicon rods in a CVD-reactor;
   applying a second voltage to each of the silicon rods by means of a second power supply unit, in order to ignite the silicon rods inside the CVD-reactor;
   applying a third voltage to each of the silicon rods in order to heat the silicon rods to a temperature in another predetermined temperature range, wherein the second voltage is lower than the first voltage; and
   forming a gas atmosphere inside the CVD-reactor, the gas atmosphere causing deposition of silicon on the silicon rod within the predetermined temperature range.

2. The method according to claim 1, wherein the third voltage is lower than the second voltage.

* * * * *